United States Patent
Ding et al.

(10) Patent No.: US 6,528,882 B2
(45) Date of Patent: Mar. 4, 2003

(54) THERMAL ENHANCED BALL GRID ARRAY PACKAGE

(75) Inventors: Yi-Chuan Ding, Kaohsiung (TW); Chang-Chi Lee, Kaohsiung (TW); Kun-Ching Chen, Tainan (TW); Yung-I Yeh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/849,137

(22) Filed: May 4, 2001

(65) Prior Publication Data

US 2002/0038908 A1 Apr. 4, 2002

(30) Foreign Application Priority Data

Oct. 4, 2000 (TW) ......................... 89120661 A

(51) Int. Cl.⁷ ................ H01L 23/34; H01L 23/24; H01L 23/10; H01L 23/06; H01L 29/40
(52) U.S. Cl. ............... 257/738; 257/712; 257/687; 257/675; 257/707; 257/729; 257/780; 257/734; 257/774; 257/720; 257/706; 257/786
(58) Field of Search ................ 257/738, 712, 257/687, 675, 707, 729, 780, 734, 774, 720, 706, 786

(56) References Cited

U.S. PATENT DOCUMENTS

| 4,835,598 A | * | 5/1989 | Higuchi et al. ............ 357/72 |
| 5,130,771 A | * | 7/1992 | Burnham .................. 357/81 |
| 5,640,048 A | * | 6/1997 | Selna .................... 257/659 |
| 5,959,356 A | * | 9/1999 | Oh ...................... 257/738 |
| 6,206,997 B1 | * | 3/2001 | Egitto et al. ............ 156/242 |
| 6,282,094 B1 | * | 8/2001 | Lo et al. ................ 361/704 |
| 6,325,272 B1 | * | 12/2001 | May et al. ................ 228/41 |

FOREIGN PATENT DOCUMENTS

| JP | 06-163737 | * | 10/1994 |
| JP | 08-250625 | * | 9/1996 |
| JP | 11-214563 | * | 6/1999 |

OTHER PUBLICATIONS

Anonymous, "Metal–core substrate with improved thermal performance", Research Disclosure Jul. 2000, p. 1271.*

* cited by examiner

Primary Examiner—David E. Graybill
Assistant Examiner—James Mitchell
(74) Attorney, Agent, or Firm—J.C. Patents

(57) ABSTRACT

A thermal enhanced ball grid array package is provided. The substrate for the package includes a metal core layer and at least a first patterned wiring layer provided thereon. A first insulating layer is provided between the first patterned wiring layer and the metal core layer. At least a second patterned wiring layer is provided on the substrate, opposite to the surface having the first patterned wiring layer. A second insulating layer having solder balls between the second patterned wiring layer and the metal core layer. The second patterned wiring layer is electrically connected to the first patterned wiring layer. Blind vias are provided in the second patterned wiring layer and the second insulating layer. A heat conductive material or solder material is filled into the blind vias to form thermal balls. The heat from the chip to the metal core layer is transferred directly through the thermal balls.

18 Claims, 2 Drawing Sheets

THERMAL ENHANCED BALL GRID ARRAY PACKAGE

CROSS-REFERENCE TO RELATED APPLICATION

This application claims the priority benefit of Taiwan application Ser. No. 89120661, filed on Oct. 4, 2000.

BACKGROUND OF THE INVENTION

1. Field of the Invention

The present invention relates to a thermal enhanced ball grid array package. More specifically, the present invention relates to a thermal enhanced ball grid array package having thermal balls.

2. Description of the Related Art

In the ever-expanding world of information, the integrated circuit is an inseparable part of daily life. Food, clothing, residence, business, education, and amusement are just some of the areas which often use products made with integrated circuits. Following constant development, greater user-friendliness, increased usefulness and higher complexity in electronic products, as well as a trend towards lightness and smallness in design, the use of electronic products has become more convenient and comfortable. In the semiconductor fabricating process, a semiconductor product having higher integration is available because of mass production of the 0.18 micron integrated circuit. However, the amount of heat generated from the device per area increases as the integration of the semiconductor device increases. Therefore, improvement of heat dissipation for the semiconductor package is important an affects the performance of the product greatly.

Referring to FIG. 1, a schematic, cross sectional view of a conventional matrix ball grid array package having thermal vias is shown.

As shown in FIG. 1, U.S. Pat. No. 5,894,410 discloses a central-and-periphery matrix ball grid array. The substrate 102 has a first surface 101 and a second surface 103 opposite to the first surface 101. The substrate 102 includes a plurality of patterned trace layers 108 and insulating layers 110 which are under the die pad 106 of the first surface 101. The patterned trace layers 108 are electrically connected to each other by plugs (not shown). The chip 120 is attached on the die pad 106 of the substrate 102 by a wire bond package technology, and is electrically connected to the gold fingers on the substrate 102 by wires 128. The chip 120 and the first surface 101 are encapsulated with a molding compound 122. Solder balls 124 are provided in a matrix on the ball pads 116 as external electrical connections. The through holes 114 penetrate the patterned trace layers 108 and the insulating layers 110 in the substrate to thermally connect the solder balls 124 to the chip 120.

The through holes 114 are designed to be provided under the chip 120, vertically penetrating the substrate 102. The length of the through hole 114 is substantially the same as the shortest distance from the first surface 101 to the second surface 103. However, the through hole 114 generally has a tubular profile, and the filling material therefor has considerable heat resistance so that the heat generated from the chip 120 can not be effectively dissipated off. Moreover, the heat generated from the chip 120 is transmitted to the solder balls 124 through the die pad 106 and the filling material in the through holes 114 and then ball pads 116. This makes the heat-dissipating path for the chip 120 longer and thus reduces the heat-dissipating performance.

SUMMARY OF INVENTION

Therefore, it is an object of the present invention to provide a thermal enhanced ball grid array package, which can be used in a semiconductor package. The chip can be attached on the metal core layer to transfer the heat generated from the chip to the metal core layer.

It is another object of the present invention to provide a thermal enhanced ball grid array package. In the package, a plurality of blind vias are formed between the metal core layer and the solder balls by laser ablating. A heat conductive material or a tin lead alloy is filled into the blind vias to form thermal balls.

It is still another object of the present invention to provide a heat-dissipating device for a semiconductor package. The heat from the chip to the metal core layer is transferred directly through the thermal balls. This provides the chip with an extremely short path for heat dissipation and increases the heat-dissipating rate and performance of a package.

According to the above and other objects of the present invention, a thermal enhanced ball grid array package is provided, comprising: a substrate, a chip, a molding compound, a plurality of solder balls, and a plurality of thermal balls. The substrate includes a metal core layer having a first surface and a second surface, with the first surface having a die pad region. At least a first patterned trace layer is provided in a region adjacent to the die pad region on the first surface. A first insulating layer is provided between the first patterned trace layer and the metal core layer. At least a second patterned trace layer is provided on the second surface. A second insulating layer between the second patterned trace layer and the metal core layer. The second patterned trace layer is electrically connected to the first patterned trace layer. The second patterned trace layer has a plurality of ball pads. A plurality of blind vias are provided in the second patterned trace layer and the second insulating layer to expose the second surface. A chip is provided in the die pad region and is electrically connected to the first patterned trace layer. A molding compound encapsulates the chip and part of the connection between the chip and the first patterned trace layer. A plurality of solder balls are provided on the surfaces of the ball pads. A plurality of thermal balls are provided in the blind vias and thermally connected to the second surface.

According to one preferred example of the present invention, the chip is attached directly on the metal core layer, so that the heat generated from chip can be directly transferred to the metal core layer. A plurality of blind vias are formed between the metal core layer and the solder balls by laser ablating. A heat conductive material and/or tin lead alloy is filled into the blind vias to form thermal balls, thereby dissipating the heat from the chip to the metal core layer through the thermal balls. This provides the chip with an extremely short path for heat dissipation. A heat sink can be additionally provided on the surface of the package to further increase the heat-dissipating rate and performance of a package.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1:
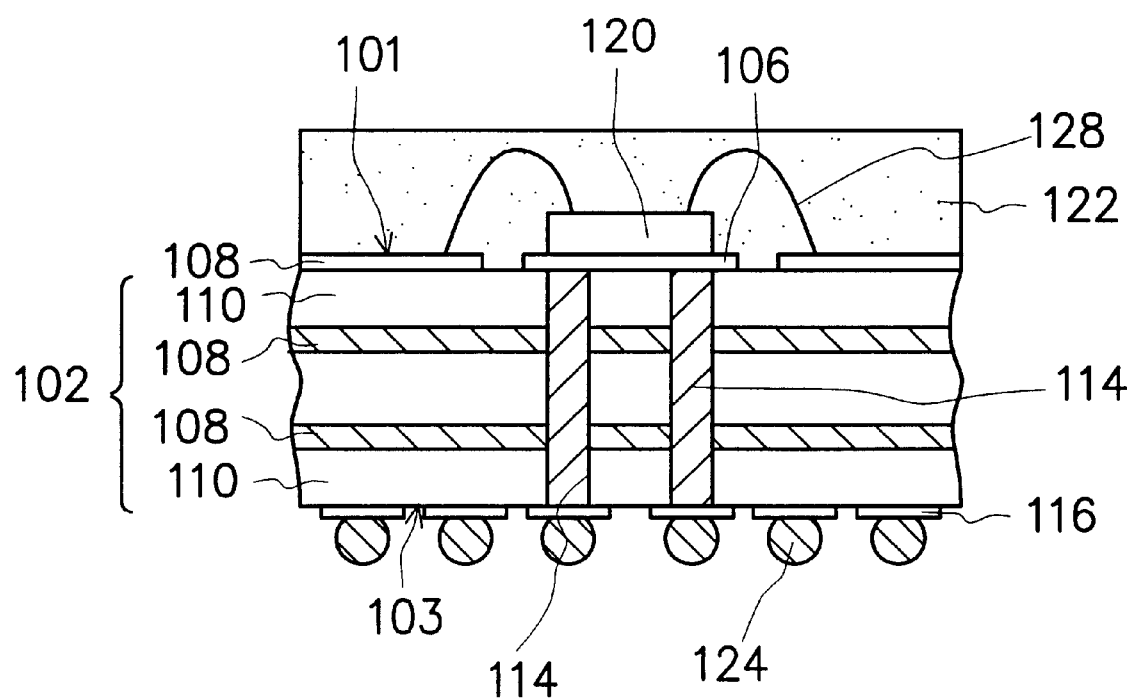
FIG. 1 is a schematic, cross sectional view of a conventional matrix ball grid array package having thermal vias for heat dissipation.

Reference will now be made in detail to the present preferred embodiments of the invention, examples of which are illustrated in the accompanying drawings. Whenever possible, the same reference numbers are used in the drawings and the description to refer to the same or like parts.

Figure 2:
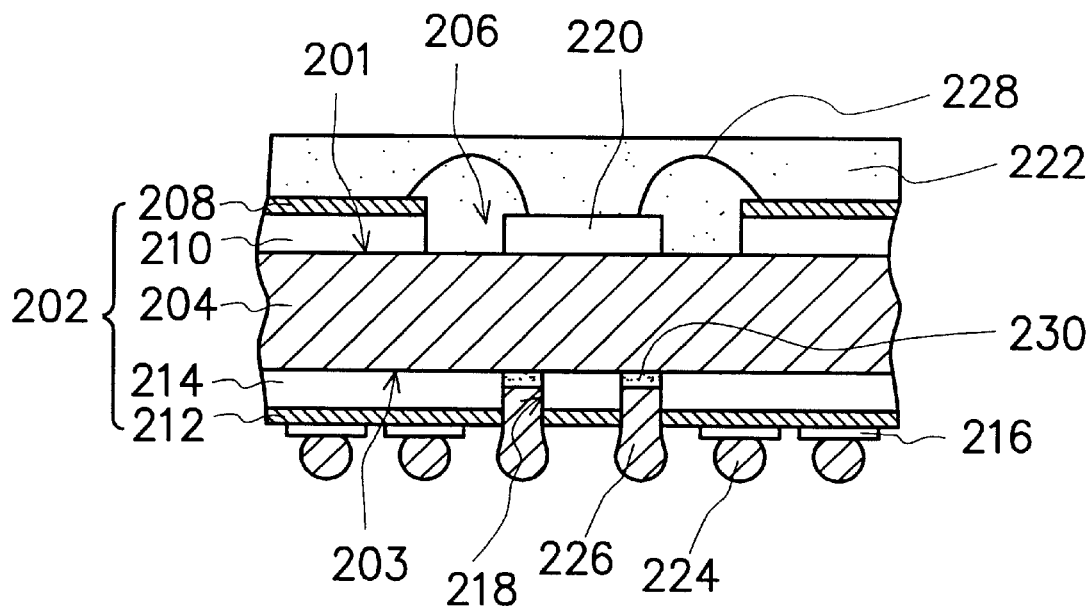
FIG. 2 is a schematic, cross sectional view of a thermal enhanced ball grid array package according to a first preferred embodiment of the present invention.

Referring to FIG. 2, a schematic, cross sectional view of a thermal enhanced ball grid array package according to a first preferred embodiment of the present invention is shown.

As shown in FIG. 2, a substrate 202 has a metal core layer 204 made of copper, for example. The metal core layer 204 has a first surface 201 having a die pad region 206 and a second surface 203. A first patterned trace layer 208 is provided in a region adjacent to the die pad region 206 on the first surface 201. A first insulating layer 210 is provided between the first patterned trace layer 208 and the metal core layer 204 directly. A chip 220 is provided on a die pad region 206 to be attached on the metal core layer 204. The first surface 201 of the metal core layer 204 is subject to an oxidation process to form a copper oxide layer on the first surface 201. The surface of the copper oxide layer can be coarser after the oxidation process. Since the copper oxide crystal is formed in a needle shape, the adhesion of the chip 220 to the metal core layer 204 and the bonding between the metal core layer 204 and the first insulating layer 210 both can be increased. The chip 220 is electrically connected to the first patterned trace layer 208 by wires 228. The chip 220 can be attached to the die pad region 206 with a heat conductive adhesive, such as silver paste and heat conductive tape. The chip 220 is attached on the die pad region 206 of the metal core layer 204, so that heat generated from the chip 220 can be transferred directly to the metal core layer 204.

A second patterned trace layer 212 is provided on the second surface 203. A second insulating layer 214 is provided between the second patterned trace layer 212 and the metal core layer 204. The second patterned trace layer 212 is electrically connected to the first patterned trace layer 208. The second patterned trace layer 212 has a plurality of ball pads 216. The second patterned trace layer 212 and the second insulating layer 214 have a plurality of blind vias to expose the surface 203 of the metal core layer 204. The first insulating layer 210 and the second insulating layer 214 can be formed of a material that is high in hardness and has high glass transition temperature (Tg), such as glass epoxy resin or bismaleimide-triazine (BT) resin. A commercially avaible substrate such as FR-4 substrate, FR-5 substrate and BT substrate can be used as the insulating layer, if desired. Since the second insulating layer 214 is thin, the blind via 218 can be formed by laser ablating. The laser used includes gas laser, solid laser, such as $CO_2$ laser, yttrium-aluminum-garnet laser (YAG laser). The carbon dioxide laser is used with a wavelength of about 10.6 microns and a beam size of about 0.1 mm. The YAG laser is used with a wavelength of about 1.064 microns and a beam size of about 0.05 mm.

The chip 220 and part of the connection between the chip 220 and the first patterned trace layer 208 are encapsulated with a molding compound 222. A plurality of solder balls 224 are provided on the surfaces of the ball pads 216 as external junctions for input/output. A plurality of thermal balls 226 are provided in the blind vias 218 and thermally connected to the second surface 203. The solder balls 224 are at the same level as the thermal balls 226 after a tin lead alloy is filled into the blind vias to form the thermal balls 226. The thermal balls 226 can be formed directly on the second surface 203. Optionally, a heat conductive material 230 can be further included between the thermal balls 226 and the second surface 203. With the design of the present invention, heat from the chip 220 to the metal core layer 204 can be transferred directly through the thermal ball 226. This provides the chip 220 with an extremely short path for heat dissipation. The solder balls 224 can be made with the same material as the thermal ball 226, a tin lead alloy. Thus, no additional concerns would add to the production process. A heat sink can be further provided on the surface of the molding compound 222 to increase the heat dissipating rate and performance of a package.

Figure 3:
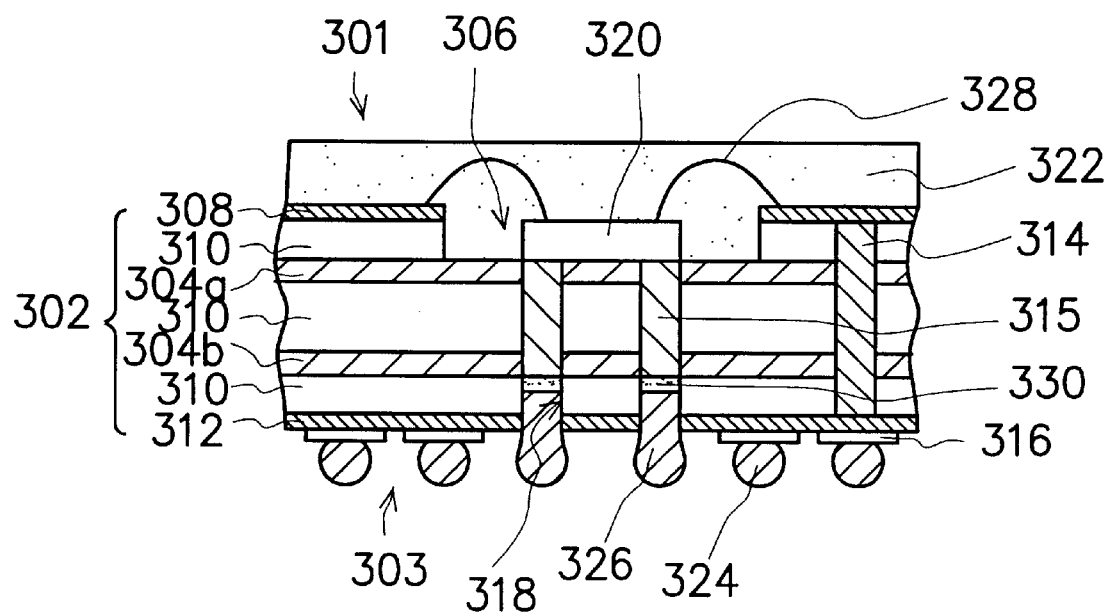
FIG. 3 is a schematic, cross sectional view of a thermal enhanced ball grid array package according to a second preferred embodiment of the present invention.

Referring to FIG. 3, a schematic, cross sectional view of a thermal enhanced ball grid array package according to a second preferred embodiment of the present invention is shown.

As shown in FIG. 3, a substrate 302 has a first side 301 and a second side 303 opposite to the first side 301. The substrate 302 consists of a plurality of patterned trace layers and insulating layers that are interposed on each other. The patterned trace layer includes a first patterned trace layer 308 on the surface of the first side 301, and a second patterned trace layer 312 on the surface of the second side 303. The second patterned trace layer 312 has a plurality of ball pads 316. A plurality of insulating layers 310 are provided between the first patterned trace layer 308 and the second patterned trace layer 312. The insulating layer 310 has a plurality of through holes 314 for electrical connection of the patterned trace layers. A plurality of thermal vias 315 are provided in the insulating layer 310. A plurality of blind vias 318 are provided in the insulating layer 310 adjacent to the second patterned trace layer 312. A plurality of heat-dissipating metal layers 304a, 304b are provided between the first patterned trace layer 308, the second patterned trace layer 312 and the insulating layers 310, respectively. A die pad region 306 is provided on the heat-dissipating metal layer 304a adjacent to the first side 301, exposing the first side 301. The heat-dissipating metal layer 304a is thermally connected to the heat-dissipating metal layer 304b through the thermal vias 315. The heat-dissipating metal layer 304b adjacent to the second side 303 is exposed through the blind vias 318. The blind vias 318 are formed by laser ablating. The thermal vias 315 are formed by mechanically drilling and then filling highly heat conductive material into the holes.

The chip 320 is electrically connected to the first patterned trace layer 308 by wires 328. The chip 320 and part of the connection between the chip 320 and the first patterned trace layer 308 are encapsulated with a molding compound 322. A plurality of solder balls 324 are provided on the surfaces of the ball pads 316 as external junctions for input/output. A plurality of thermal balls 326 are provided in the blind vias 318 and are thermally connected to the heat-dissipating metal layer 304b adjacent to the second side 303. The solder balls 324 are at the same level as the thermal balls 326 after a tin lead alloy is filled into the blind vias to form the thermal balls 326. The thermal balls 326 can be formed directly on the heat-dissipating metal layer 304b. Optionally, a heat conductive material 330 can be further included between the thermal balls 326 and the heat-dissipating metal layer 304b adjacent to the second side 303. With the design of the present invention, heat from the chip 320 to the heat-dissipating metal layer 304b can be transferred to the thermal ball 326 directly through the thermal vias 315 and the heat-dissipating metal layer 304b. This provides the chip 320 with an extremely short path for heat dissipation. The material for the solder balls 324 can be made of the same material as the thermal ball 326, a tin lead alloy. Thus, no additional concerns would add to the production process. A heat sink can be further provided on the surface of the molding compound 322 to increase the heat dissipating rate and performance of a package.

Although the above example is illustrated by exemplifying the substrate 302 having heat-dissipating metal layers 304a and 304b, the present invention is not limited to such a substrate. It is well known in the art that most laminated boards used for semiconductors can be applied in the thermal enhanced ball grid array package of the present invention to increase the heat-dissipating rate and performance.

Furthermore, in the above example, the thermal vias 315 and the blind vias 318 are formed in different processes. However, they can also formed together in the same process. The patterned trace layers 308 and 312, the insulating layer 310 and the heat-dissipating metal layers 304a and 304b in the substrate 302 are laminated. The through holes 314 are then formed. Thereafter, drilling is carried out directly in the die pad region 306, i.e. the heat-dissipating holes 315 and blind vias 318 are formed simultaneously. Subsequently, the highly heat conductive material is filled to form thermal balls 326. The structure of the embodiment can be obtained by this process.

In summary, the present invention provides the following advantages:

1. Only a die pad region is required on the substrate to attach the chip on the metal core layer. The heat generated from chip can be directly transferred to the metal core layer to reduce the heat resistance and increase the heat-dissipating efficiency.
2. A plurality of blind vias are formed by laser ablating to expose the metal core layer or the heat-dissipating metal layer. Heat conductive material and/or tin lead alloy is filled in the blind vias to form thermal balls. The heat from the chip to the metal core layer is transferred directly through the thermal balls.
3. The heat generated from the chip to the metal core layer can be transferred directly through the thermal balls. This provides the chip with a shortened path for heat dissipation. The heat-dissipating efficiency is thus increased.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A thermal enhanced ball grid array package, comprising:
    a substrate, including:
        a metal core layer having a first surface and a second surface opposite to the first surface, with the first surface having a die pad region and the second surface having a corresponding die pad region;
        a first patterned trace layer provided in a region adjacent to the die pad region on the first surface, wherein a first insulating layer is provided between the first patterned trace layer and the metal core layer; and
        a second patterned trace layer provided on the second surface, with a second insulating layer being provided between the second patterned trace layer and the metal core layer, wherein the second patterned trace layer has a plurality of ball pads around the corresponding die pad region of the second surface of the metal core layer to electrically connect to the first patterned trace layer, and a plurality of blind vias are formed under the corresponding bonding pad region of the metal core layer through the second patterned trace layer and the second insulating layer;
    a chip attached on the die pad region of the first surface of the metal core layer and electrically connected to the first patterned trace layer;
    a molding compound to encapsulate the chip an part of the connection of the chip and the first patterned trace layer;
    a plurality of solder balls provided on the surfaces of the ball pads; and
    a plurality of thermal balls integrally formed through the blind vias.

2. The thermal enhanced ball grid array package of claim 1, wherein the material for the metal core layer is copper.

3. The thermal enhanced ball grid array package of claim 1, wherein the chip is thermally connected to the metal core layer.

4. The thermal enhanced ball grid array package of claim 1, wherein the material for the first insulating layer and the second insulating layer is selected from a group consisting of glass epoxy resin, bismaleimide-triazine (BT) resin and epoxy resin.

5. The thermal enhanced ball grid array package of claim 1, wherein the material for the solder balls and the thermal balls is tin lead alloy.

6. The thermal enhanced ball grid array package of claim 1, wherein the solder balls are at the same level as the thermal balls.

7. The thermal enhanced ball grid array package of claim 1, wherein the material for the metal core layer is copper, and the first surface is subject to an oxidation process to form a copper oxide layer on the first surface.

8. The thermal enhanced ball grid array package of claim 1, wherein a heat conductive material is included between the thermal balls and the second surface.

9. The thermal enhanced ball grid array package of claim 1, wherein the blind vias are formed by laser ablating.

10. A thermal enhanced ball grid array package, comprising:
    a substrate, including:
        a metal core layer having a first surface and a second surface opposite to the first surface, with the first surface having a die pad and the second surface having a corresponding die pad region;

a first patterned trace layer provided in a region adjacent to the die pad region on the first surface, wherein a first insulating layer is provided between the first patterned trace layer and the metal core layer; and a second patterned trace layer provided on the second surface, with a second insulating layer being provided between the second patterned trace layer and the metal core layer, wherein the second patterned trace layer has a plurality of ball pads around the corresponding die pad region of the second surface of the metal core layer to electrically connect to the first patterned trace layer, and a plurality of blind vias are formed under the corresponding bonding pad region of the metal core layer through the second patterned trace layer and the second insulating layer;

a plurality of thermal vias in the substrate under the die pad region of the first surface of the metal core layer, wherein the thermal vias are directly connected to the blind vias;

a chip attached on the die pad region of the first surface of the metal core layer and electrically connected to the first patterned trace layer;

a molding compound to encapsulate the chip and part of the connection of the chip and the first patterned trace layer;

a plurality of solder balls provided on the surfaces of the ball pads; and a plurality of thermal balls integrally formed through the blind vias.

11. The enhanced heat-dissipating ball grid array package of claim 10, wherein the material for the metal core layer is copper.

12. The enhanced heat-dissipating ball grid array package of claim 10, wherein the chip is thermally connected to the metal core layer.

13. The enhanced heat-dissipating ball grid array package of claim 10, wherein the material for the insulating layers is selected from a group consisting of glass epoxy resin, bismaleimide-triazine (BT) resin and epoxy resin.

14. The enhanced heat-dissipating ball grid array package of claim 10, wherein the material for the solder balls and the thermal balls is tin lead alloy.

15. The enhanced heat-dissipating ball grid array package of claim 10, wherein the solder balls are at the same level as the thermal balls.

16. The enhanced heat-dissipating ball grid array package of claim 10, wherein the material for the metal core layer is copper, and the die pad region is subject to an oxidation process to form a copper oxide layer on the surface thereof.

17. The enhanced heat-dissipating ball grid array package of claim 10, wherein a heat conductive material is included between the thermal balls and the surfaces of the metal core layer in the blind vias.

18. The package of claim 10, wherein the thermal vias are aligned with the blind vias, respectively.

* * * * *